(12) United States Patent
Motika et al.

(10) Patent No.: US 7,774,662 B2
(45) Date of Patent: Aug. 10, 2010

(54) METHOD AND STRUCTURE FOR PICOSECOND-IMAGING-CIRCUIT-ANALYSIS BASED BUILT-IN-SELF-TEST DIAGNOSTIC

(75) Inventors: Franco Motika, Hopewell Junction, NY (US); Peitin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/927,030

(22) Filed: Oct. 29, 2007

(65) Prior Publication Data

US 2008/0077833 A1    Mar. 27, 2008

Related U.S. Application Data

(63) Continuation of application No. 10/780,878, filed on Feb. 19, 2004, now Pat. No. 7,308,626.

(51) Int. Cl.
*G01R 31/28* (2006.01)
(52) U.S. Cl. ...................................... 714/726
(58) Field of Classification Search ....................... None
See application file for complete search history.

(56) References Cited

U.S. PATENT DOCUMENTS

| 5,175,494 | A | * | 12/1992 | Yoshimori | 714/728 |
|---|---|---|---|---|---|
| 5,701,308 | A | | 12/1997 | Attaway et al. | |
| 5,920,575 | A | * | 7/1999 | Gregor et al. | 714/726 |
| 6,437,623 | B1 | * | 8/2002 | Hsu et al. | 327/202 |
| 6,662,324 | B1 | * | 12/2003 | Motika et al. | 714/726 |
| 6,687,866 | B2 | | 2/2004 | Fukuda | |
| 2004/0083412 | A1 | | 4/2004 | Corbin et al. | |

FOREIGN PATENT DOCUMENTS

JP   04192336 A2   7/1992
JP   05304261 A2   11/1993

* cited by examiner

*Primary Examiner*—Christine T Tu
(74) *Attorney, Agent, or Firm*—McGinn IP Law Group, PLLC

(57) ABSTRACT

A method (and structure) of at least one of testing, diagnosing, and monitoring an operation of an electronic circuit, includes interrupting a clock signal used to provide a clocking for a normal operation of the circuit and using a second clock signal to repeatedly cycle through a predetermined cycle of operations for the circuit.

9 Claims, 17 Drawing Sheets

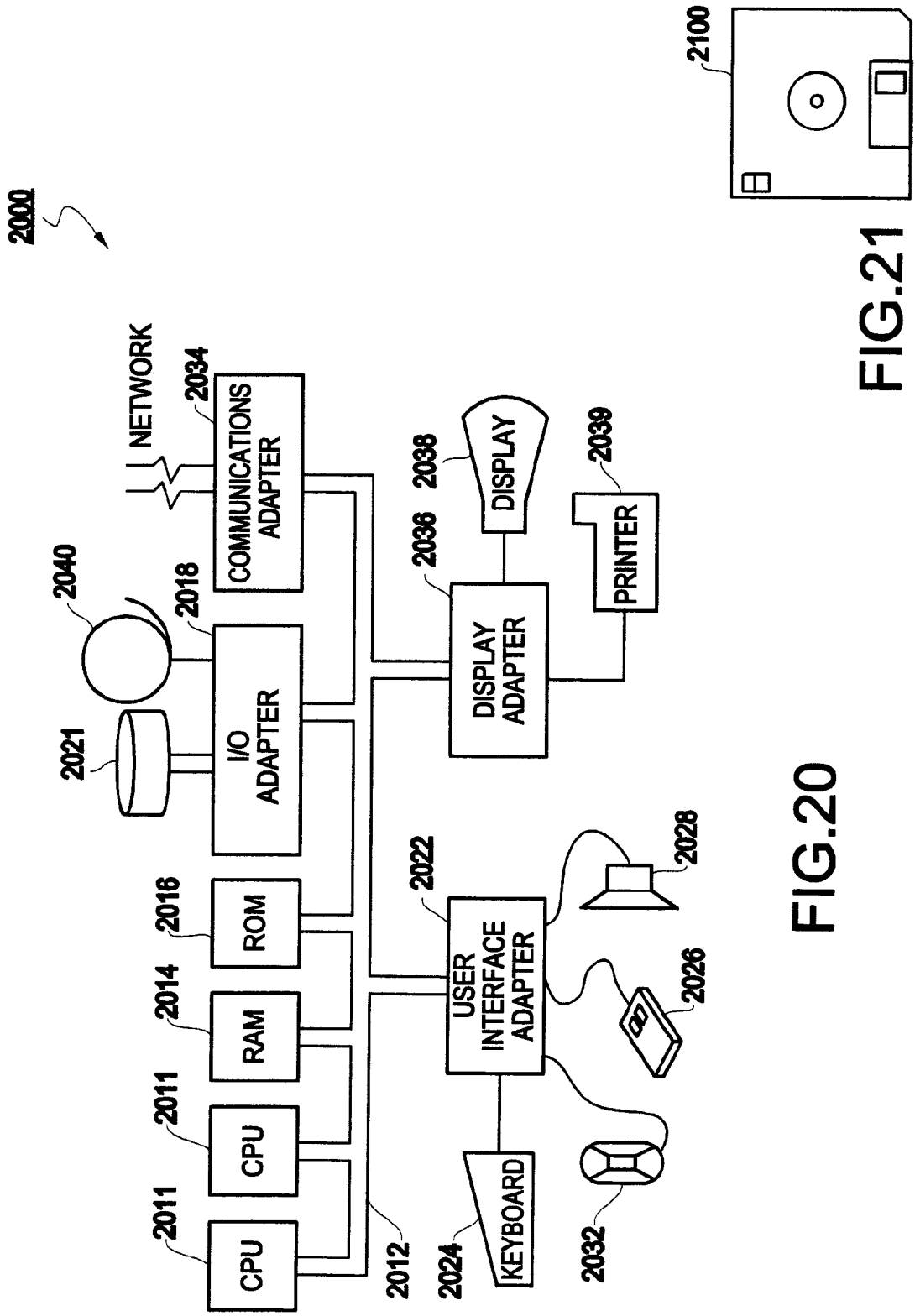

METHOD AND STRUCTURE FOR PICOSECOND-IMAGING-CIRCUIT-ANALYSIS BASED BUILT-IN-SELF-TEST DIAGNOSTIC

This application is a continuation application of U.S. patent application Ser. No. 10/780,878, filed on Feb. 19, 2004, now U.S. Pat. No. 7,308,626.

BACKGROUND OF THE INVENTION

1. Field of the Invention

The present invention generally relates to testing and diagnosis of failures in integrated circuits. More specifically, a clocking signal in a Built-In Self Test (BIST) sequence is interrupted to permit a second clocking cycle to repeatedly recycle through a particular section of the BIST. In an exemplary embodiment, activity in the circuit is determined by detecting photons emitted during this second clocking cycle.

2. Description of the Related Art

The rapid densification of VLSI (Very Large Scale Integrated) circuit devices, associated with high speed circuit performance, and relatively short time-to-market, has driven the need to rapidly characterize and diagnose complex designs early in the product cycle.

Concurrently, conventional characterization test tools and diagnostic techniques, already somewhat limited, are quickly becoming obsolete. These problems in turn show the need for a novel test and diagnostic methodology that combines new Physical Failure Analysis (PFA) tools with integrated test and diagnostics support built-in the semiconductor device. Some of the built-in test and diagnostic functions may be based on several Design for Test (DFT) techniques such as Level Sensitive Scan Design (LSSD), Logic Built-In-Self-Test (LBIST), Array Built-In-Self-Test (ABIST), On-product-clock-generation (OPCG), and others.

Thus, a need exists so that testing tools and diagnostic methods keep pace with the newer techniques of semiconductor design and fabrication.

SUMMARY OF THE INVENTION

In view of the foregoing, and other, exemplary problems, drawbacks, and disadvantages of the conventional system, it is an exemplary feature of the present invention to provide a novel technique for integrated circuit testing and diagnosis.

It is another exemplary feature of the present invention to overcome a problem in a testing technique in which emitted photons are detected to determine circuit activity.

It is another exemplary feature of the present invention to provide a technique that can be used to overcome a problem in a testing technique in which circuit activity is shielded by overlying layers of wiring on a chip.

It is another exemplary feature of the present invention to provide a method in which photon emission can be amplified in a Built-In Self Test (BIST) process by repeatedly recycling through a sequence of the BIST test.

It is another exemplary feature of the present invention to provide a method in which a normal clocking cycle of a BIST test is interrupted and a second clocking cycle is used to repeatedly exercise a sequence of the BIST test.

To achieve the above exemplary features and others, in a first exemplary aspect of the present invention, described herein is a method of at least one of testing, diagnosing, and monitoring an operation of an electronic circuit, including interrupting a clock signal used to provide a clocking for a normal operation of the circuit and using a second clock signal to repeatedly cycle through a predetermined cycle of operations for the circuit.

In a second exemplary aspect of the present invention, described herein is a structure to execute the above-described method.

In a third exemplary aspect of the present invention, described herein is also a signal-bearing medium tangibly embodying a program of machine-readable instructions executable by a digital processing apparatus to perform the above-described method.

In a fourth exemplary aspect of the present invention, described herein is also an electronic circuit including at least one scan chain of latches and a mechanism to allow a data flow in the scan chain to be reversed in direction.

In a fifth aspect of the present invention, described herein is an apparatus having at least one component having at least one electronic circuit that includes at least one scan chain of latches and a mechanism to allow a data flow in the scan chain to be reversed in direction.

In a sixth aspect of the present invention, also described herein is a method of at least one of testing, diagnosing, and monitoring an operation of an electronic circuit, including mounting the electronic circuit such that a photodetector can detect photon emissions due to an operation of the electronic circuit, exercising the electronic circuit with a built-in-self-test sequence, determining a position in the built-in-self-test sequence where a failure occurs, and recycling a plurality of times through a sequence of the built-in-self-test sequence at the determined position in the built-in-self-test, the photodetector detecting a photon emission due to activity of the electronic circuit during the recycling, the recycling thereby causing an amplification effect of the photon emission during the recycling.

The exemplary embodiments of present invention provides, for example, an improvement in the testing and diagnosis methods of integrated circuits by providing a method in which a portion of a test sequence is repeatedly recycled to allow data to be accumulated for analysis of the circuit operation and failed components.

BRIEF DESCRIPTION OF THE DRAWINGS

The foregoing and other exemplary features, aspects and advantages will be better understood from the following detailed description of an exemplary embodiment of the invention with reference to the drawings, in which:

FIG. 20 illustrates an exemplary hardware/information handling system 2000 for incorporating the present invention therein; and FIG. 21 illustrates a signal bearing medium 2100 (e.g., storage medium) for storing steps of a program of a method according to the present invention.

DETAILED DESCRIPTION OF AN EXEMPLARY EMBODIMENT OF THE INVENTION

Figure 1:
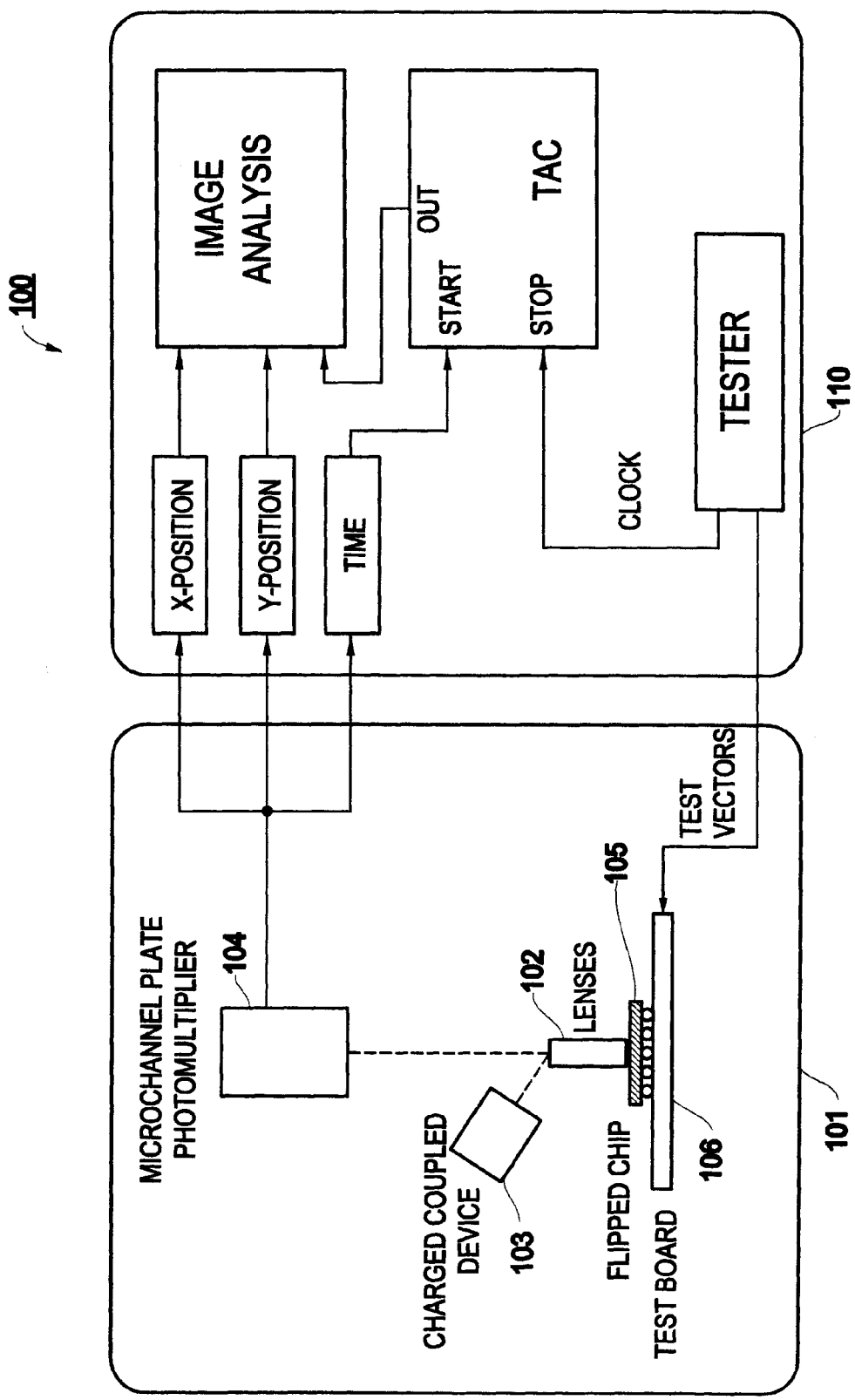
FIG. 1 exemplarily shows the Picosecond Imaging Circuit Analysis (PICA) technique 100, as it might exemplarily be utilized in the present invention.

Referring now to the drawings, and more particularly to FIGS. 1-21, exemplary embodiments of the present invention will now be described.

The present invention provides improvements on the concepts of two relatively new semiconductor diagnostic/testing techniques of LBIST (Logic Built-In-Self-Test) and PICA (Picosecond Imaging Circuit Analysis). Both of these concepts will be described in more detail below, but, in summary, LBIST is a scanning pattern technique to exercise an electronic circuit, and PICA is a technique in which circuit component operation is determined by detecting photons emission.

The inventors have recognized that a basic problem encountered in testing complex devices that incorporate Built-in-Self-Test (BIST) and utilize the PICA concepts for diagnosis is that the very small amount of light emission makes it difficult to detect circuit operation. This problem is further complicated in a scan design environment where the pattern setup is loaded serially via the scan chain, thereby reducing the test stimuli application rate by several orders of magnitude.

The inventors have further recognized that one possible solution to this diagnostic and characterization problem is to provide a simple means of generating a stimuli pattern that can be applied at high rates.

Therefore, as will be better understood following a short discussion below on the concepts of BIST and PICA, a key aspect of the novel solution proposed herein is to modify the scan chain design such that the same critical stimuli pattern can be restored and re-applied on every cycle, thereby causing this critical pattern to be repeated many times to amplify the photonic emission detection ability during this critical pattern.

However, before describing details of the novel techniques of the present invention, the following background information on PICA and BIST is provided for properly explaining and understanding the significance of the features of the exemplary embodiments of the present invention.

PICA Overview

PICA was developed to provide a fault localization tool which would be useable on flip chip mounted packages. The physics behind the technique are simple: as a transistor switches, a short burst of infrared light is emitted in the form of a photon. The PICA tool prototypes that have been built by the present Assignee allow one to resolve the arrival of the photon in X and Y, the area from which it was emitted, as well as T, the time during a test loop at which it was emitted.

The emission thus provides one with a timing sequence, or movie, of all the switches occurring in the area of interest during a test pattern. Thus far, PICA has been used to diagnose failures in test chips and product at the present Assignee's facilities, ensuring fast debug of faulty processes and designs. The uses have been primarily for characterization of existing designs once they were available in hardware. More proactive uses of PICA have begun to occur, primarily in the form of measurements of gate delay on Complementary Metal-Oxide-Semiconductor (CMOS) technologies before their use, thus helping to improve models. Therefore, PICA provides the ability to know the real impact of a technology on a design's timing.

Thus, this new circuit testing technique called Picosecond Imaging Circuit Analysis (PICA) captures weak, transient light pulses that are emitted by individual switching transistors through the backside of the chip. The use of PICA as a diagnostic and characterization tool is an emerging technology that can provide precise identification of defect location. It is important to locate defects precisely to improve both the speed and the likelihood that a defect can be analyzed to determine its root cause.

Scientists have known since the 1980s that electrons emit light known as photons when they speed through field effect transistors (FETs), the building blocks of CMOS microchips. Microprocessors and memory chips can be made from CMOS circuits. The electrons move only when the CMOS circuits change from one state to another, switching "on" or "off". Detecting these very faint light emissions can be used to monitor the switching of individual components of advanced CMOS chips.

High-speed optical detectors can be used to monitor light emissions from simple high-speed circuits. A sophisticated detector can permit imaging and time resolving light emission from hundreds or thousands of devices on a chip simultaneously. The PICA technique produces "movies" of information flowing through complex chips, such as microprocessors. The technique was named "picosecond imaging circuit analysis" because the pulses of light last for only picoseconds (trillionths of a second).

Therefore, PICA is a method for recording time and location of photon emission and is positioned in the diagnostic process with other tools, such as e-beam (electron-beam probing), emission microscopy, and FIB (focused-ion-beam milling and repair). E-beam and emission microscopy provide information about the operation of circuitry that is not directly measurable by electrical testing or other forms of contact probing. FIB may be used to expose otherwise hidden circuit components for contact or contact-less probing or may be used to modify internal circuit connectivity as an aid to indirectly deducing a failure mechanism.

PICA can be used for chip characterization including timing and clock skew. PICA can also be used for failure analysis such as for direct current (dc) and timing fails. Practically, since few photons are generated per switch, a high repetition rate is needed. Thus, PICA can only be used today practically for clocking, scanning, and memory self-testing.

Chip innovations include increasing speed, decreasing size, and new packaging styles. These innovations drive changes in the technologies needed to test and debug the chips. Such tests are critical for identifying failures and faults in chip designs and manufacturing.

In earlier chip generations, only one or two wiring layers interconnected the transistors, so that most of the transistors and wires were directly visible. More recently, however, the wiring on the chip is much more complex, leading to as many as eight levels of wiring. Bottom layers of wires and transistors are often almost completely covered by the upper layers of wires. As a result, traditional methods of measuring electrical activity on a chip are becoming impractical. PICA helps overcome this masking effect because of its capability to look at the transistors through the backside of a chip, where no metal wires get in the way.

As mentioned, normally biased CMOS logic circuits emit photons for only a short period during the switching transient, allowing precise timing of individual transistors. Since lightly doped silicon substrates absorb a portion of the bandwidth of the emitted light from backside, samples to be analyzed are usually thinned first to improve emission intensity. The samples require no further preparation, and the chip package and socketing used throughout the measurement are the same as those used in electrical testing.

The PICA system 100 exemplarily shown in FIG. 1 includes an imaging section 101 with a light-tight enclosure for the components 102, 103, 104 that detect the photon emission for the chip 105 mounted on test board 106. The timing section 110 is used to control the test sequence and analyze the photon emission image.

Thus, in PICA, an automated tester 100 is used to stimulate the packaged device so that the transistors to be studied are switched repetitively. A standard infrared microscope 102, 103 is used to magnify and focus these devices onto the detection apparatus 104, which is exemplarily a thermoelectrically-cooled microchannel-plate (MCP) photomultiplier with a position-sensitive resistive anode, thereby determining both the location and the time of a photon emission.

Two steps are employed to reduce the overall measurement time. First, the use of software or tester diagnostics minimizes the number of devices to be investigated. This information is used to select the magnification needed to spatially resolve the nearest transistors and to determine the number of measurements needed and their locations, given the field of view determined by the minimum usable magnification. The second step is selection of a test pattern that will rapidly cycle the circuits of interest through a desired switching state.

Figure 2:
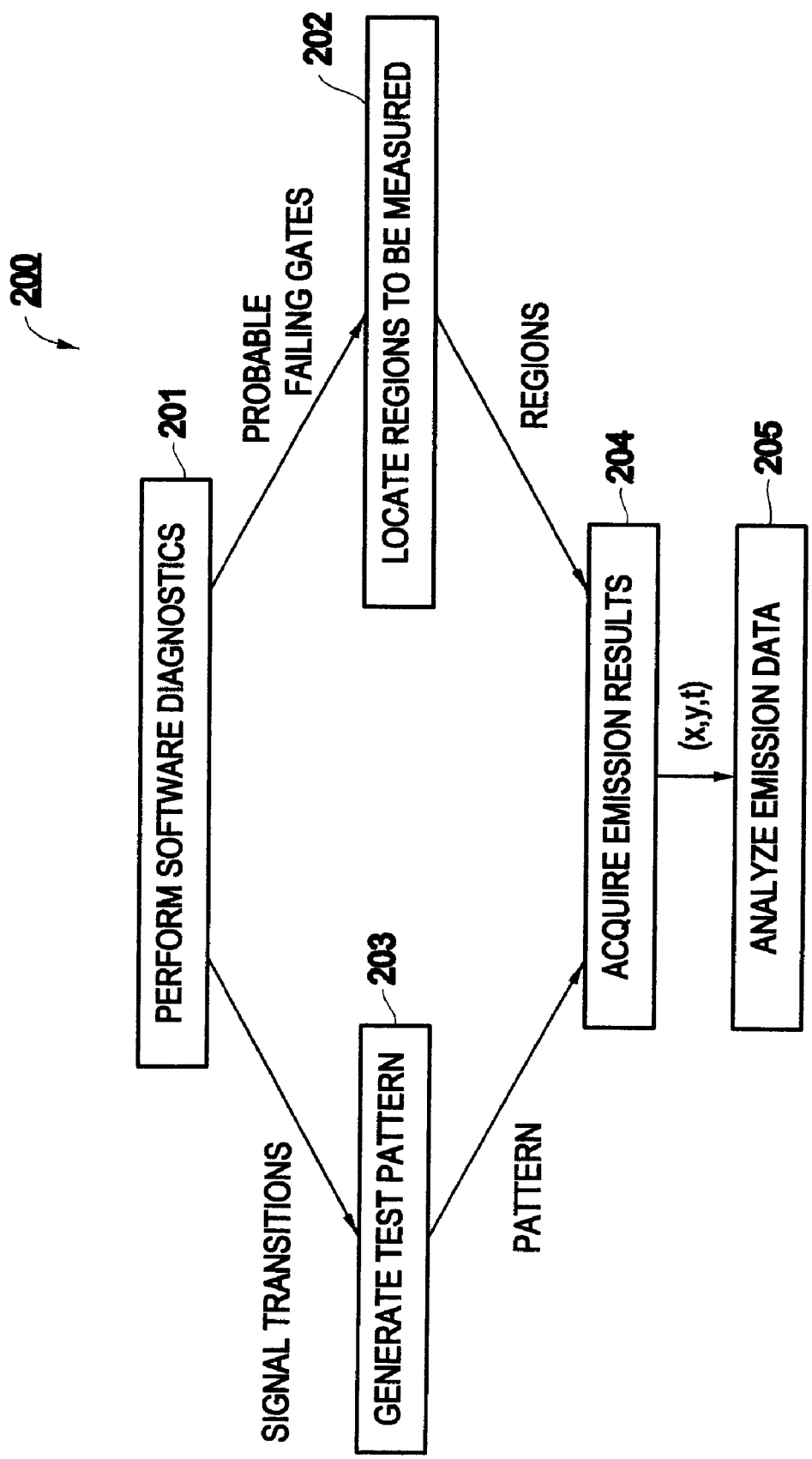
FIG. 2 shows an exemplary flowchart 200 for PICA.

FIG. 2 shows an exemplary flow chart 200 of the PICA diagnostic procedure. In step 201, a software diagnosis is exercised, during which it can be determined in step 202, which regions are likely to include failing gates and to generate, in step 203, the test patterns appropriate to exercise these regions are generated in step 202. The data collected from the measurements in step 204 is then processed in step 205 to provide insights into the device operation.

Integration of the measured data, over time, creates an "emission photograph", which shows the locations of all devices that switched throughout the test sequence. Selecting a single emission "spot" in the (x, y) plane of the collected image and plotting the time dependence of the emission intensity of the spot yield an optical waveform of the emission of the transistor or transistors within the spot.

Layout-to-schematic mapping is used to relate optical waveforms to circuit schematic elements, and provides a means for comparison to circuit simulation. Circuit delays and logic evolution can be deduced from the waveform and circuit schematic information. A circuit stuck at a high or low value is detectable by comparing the predicted switching activity of a good device for a tester pattern to the measured switching activity for that pattern. A timing failure is located by comparing the simulated time of such switching to the measured time of the switching.

Unfortunately, PICA cannot conventionally be used in certain testing situations because the weak, transient light pulses of the circuits of the chips are undetectable. For example, the LBIST test technique cannot use PICA. PICA techniques require high repetition rates of specific test patterns in order to get a sufficiently good image.

Test patterns that have worked well with PICA are clocking patterns and scan patterns, both of which have high repetition rates. Conventional standard chip test technique such as LBIST does not have high repetition rates. Thousands of clocks must be applied to fully load a scan chain for each test pattern, and only one clock in 100 or more patterns may cause a fail. The duty cycle can easily be less than $\frac{1}{100,000}$. Therefore, a circuit that fails during an LBIST test is simply not stimulated often enough to provide a PICA image, and PICA, although a valuable testing technique, cannot presently be used for detecting LBIST fails.

The present invention provides a way to overcome this deficiency.

BIST Overview

This section briefly describes the general theory of operation and characteristics of the LFSR (Linear Feedback Shift Register). Although the LFSR has many uses in testing, communication, and encryption applications, the intent here is to use the LFSR as a source of pseudo-random binary sequences.

The LFSR is a special configuration of a "linear circuit" into a special form of shift register or counter. These circuits require only a clock input, making them autonomous, and includes three basic logic components:

1) Latch or D-type flip-flop or a unit delay;
2) Exclusive-OR (XOR) or modulo-2 adder; and
3) Modulo-2 scalar multiplier.

Figure 3:
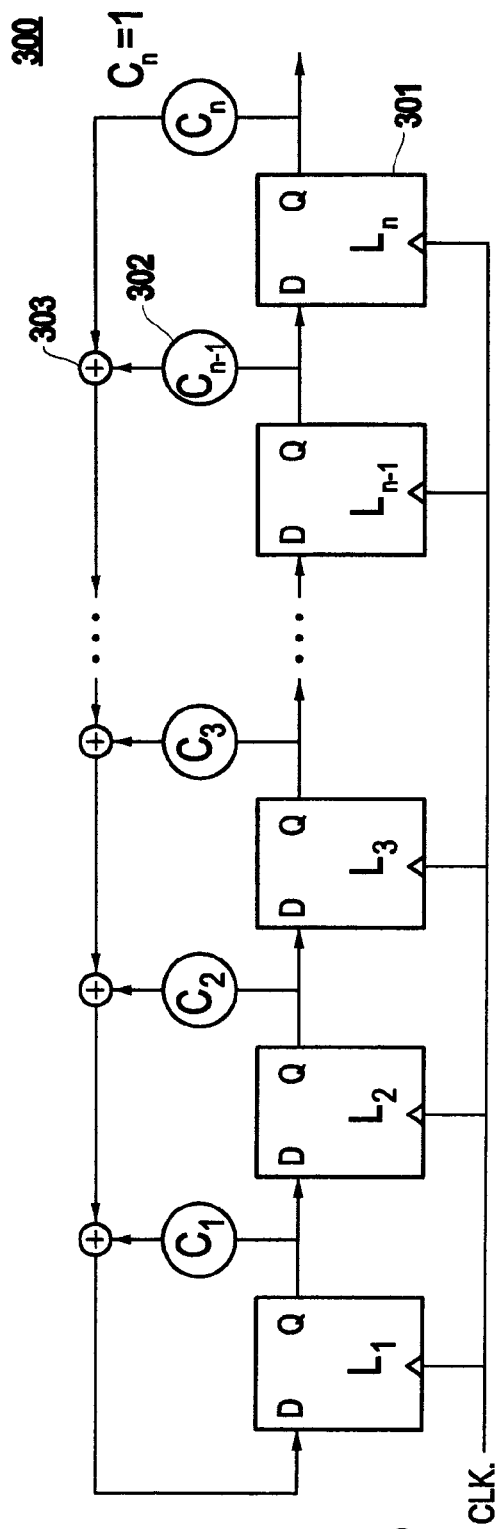
FIG. 3 exemplarily shows a generic "standard" Linear Feedback Shift Register (LFSR) configuration 300.
Figure 4:
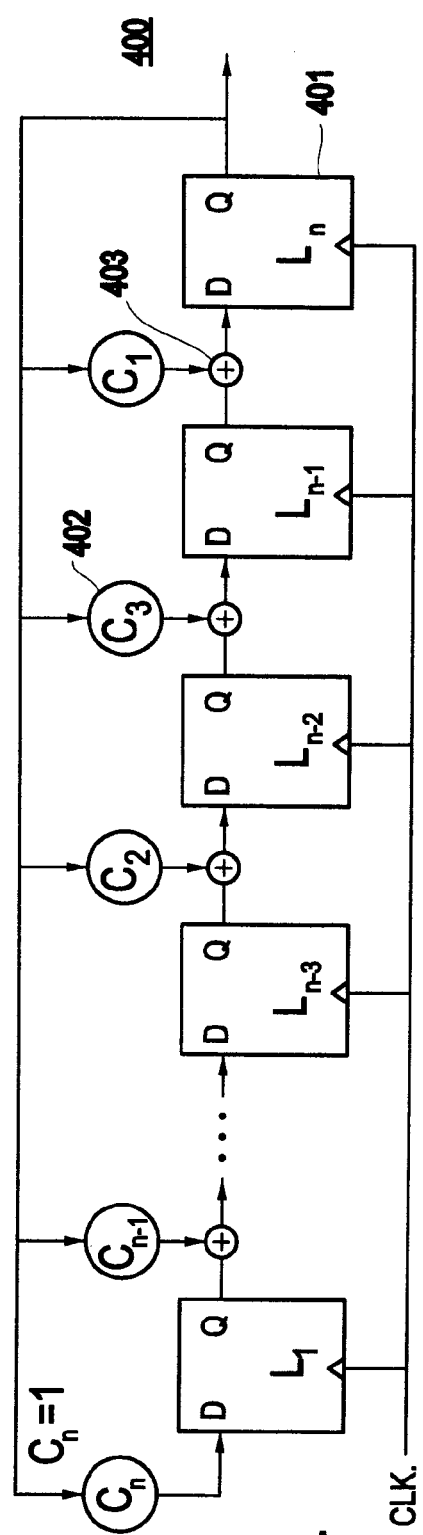
FIG. 4 exemplarily shows a "modular" Linear Feedback Shift Register (LFSR) configuration 400.

The LFSR circuit can take either of two equivalent or dual forms. FIG. 3 exemplarily shows a generic "standard" LFSR configuration 300, and FIG. 4 exemplarily shows the "modular" configuration 400. Each cell 301, 401 in each type has the same structure and is replicated to obtain the desired length n of the LFSR. The modulo-2 scalar multiplier ($C_i$) 302, 402 is either 0 or 1, which results in a connection or no-connection for the feedback signal. The modulo-2 adder 303, 403 is equivalent to an exclusive-OR logic circuit.

Figures 5, 6:
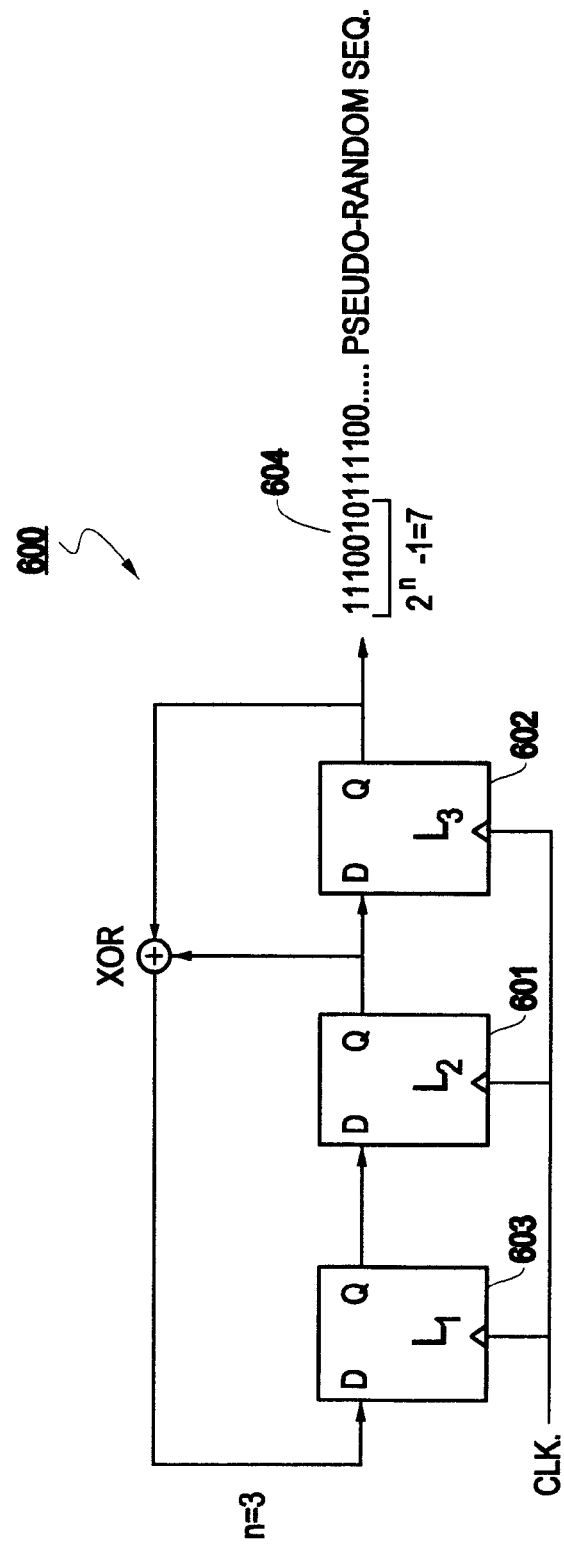
FIG. 5 shows the exclusive-OR logic truth table 500 for a modulo-2 adder.
FIG. 6 shows an exemplary LFSR circuit 600 having length n=3.

The truth table 500 for a modulo-2 adder is shown in FIG. 5. FIG. 6 shows a simple example of an LFSR circuit 600 for length n=3.

Some of the characteristics of a LFSR are its length or number of cells (n), the feedback configuration or values of $C_i$, and the initial state of the circuit. A "maximal length" LFSR is a circuit that cycles through 2n−1 unique states when initialized with a non-zero value. Of course, the maximum number of states of an n-length shift register is 2n, so a maximal length LFSR cycles through all the possible states except when initialized to zero. A non-maximal length LFSR also cycles through a sub-set of 2n states depending on the initial seed or initial value. For simplicity and the purpose of this concept's explanation and effectiveness, only maximal length LFSR implementations are considered.

The example in FIG. 6, therefore, shows a simple three stage (n=3) maximal length configured LFSR. In this case, the outputs from latches L2 (601) and L3 (602) are XORed and fed back to L1 (603).

Figure 7:
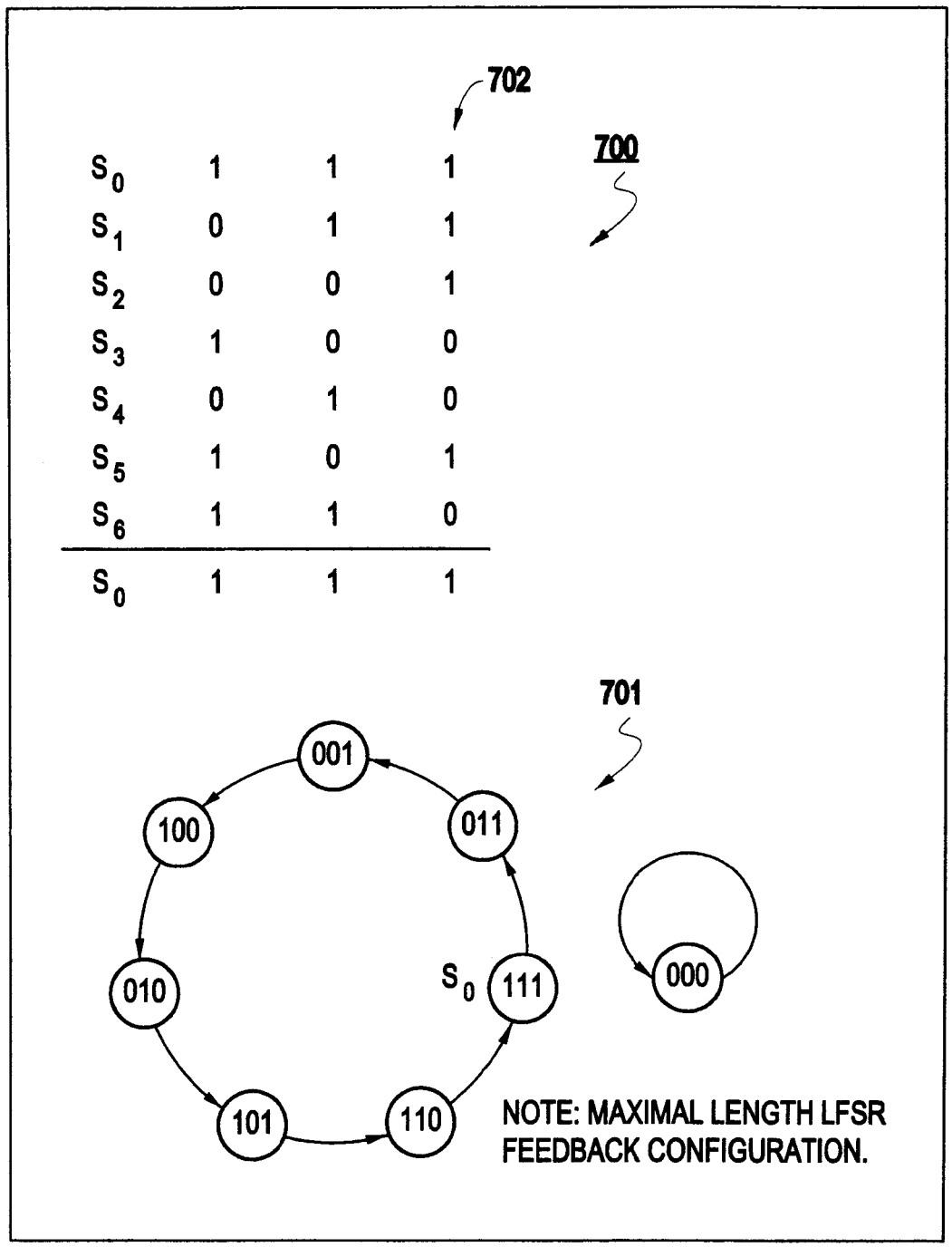
FIG. 7 shows the state table 700 and state diagram 701 for the LFSR of FIG. 6.

FIG. 7 shows the state table 700 and state diagram 701 for the LFSR of FIG. 6, having n=3, and show the sequence of states that this LFSR cycles through after being initialized to all "1"s at state $S_o$. The binary output sequence for this example is seven bits before it starts repeating (e.g., "1110010", see 604 in FIG. 6 and 702 in FIG. 7).

One can easily extend the length of this simple circuit 600 to provide long sequences of binary pseudo-random numbers. For example, a 32-bit maximal length LFSR can cycle for over four billion states before repeating (e.g., $2^n-1$). Furthermore, by selecting the appropriate feedback parameters for the LFSR, one can generate unique sequences for each configuration. Maximal configuration tables for many values of n are readily available in many references or can be easily generated.

Hereinbelow is briefly described the general theory of operation and characteristics of the LFSR when used for data compression as a signature generation register. There are many data compression algorithms and hardware implementations that can be used to generate signatures, but the use of an LFSR as a SISR (Single Input Signature Register) or MISR (Multiple Input Signature Register) has the advantage that it can be easily implemented in both hardware and software with low aliasing probability and a high degree of customization flexibility.

Figure 8:
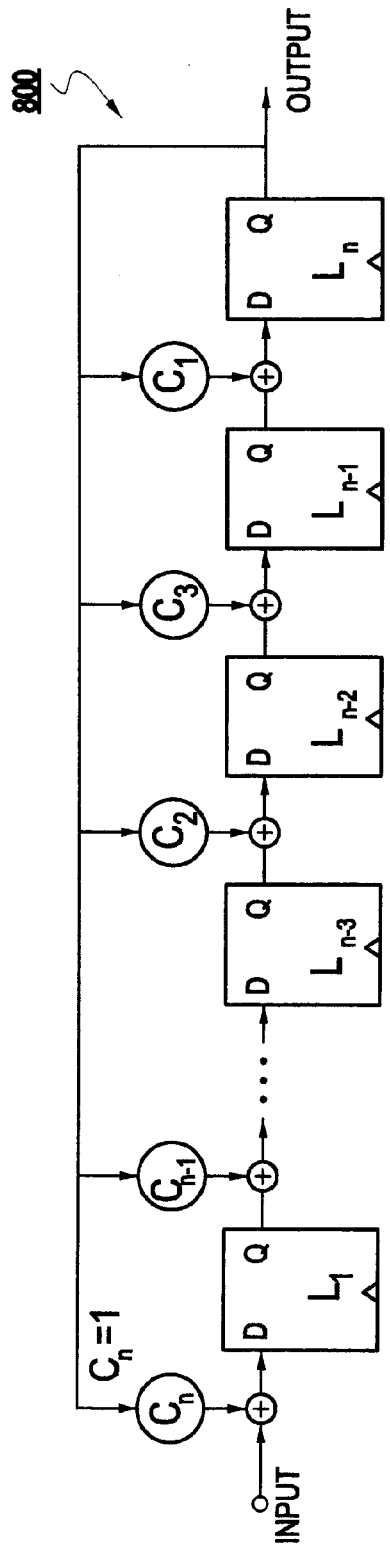
FIG. 8 exemplarily shows an LFSR configured as a Single Input Signature Register (SISR) 800.
Figure 9:
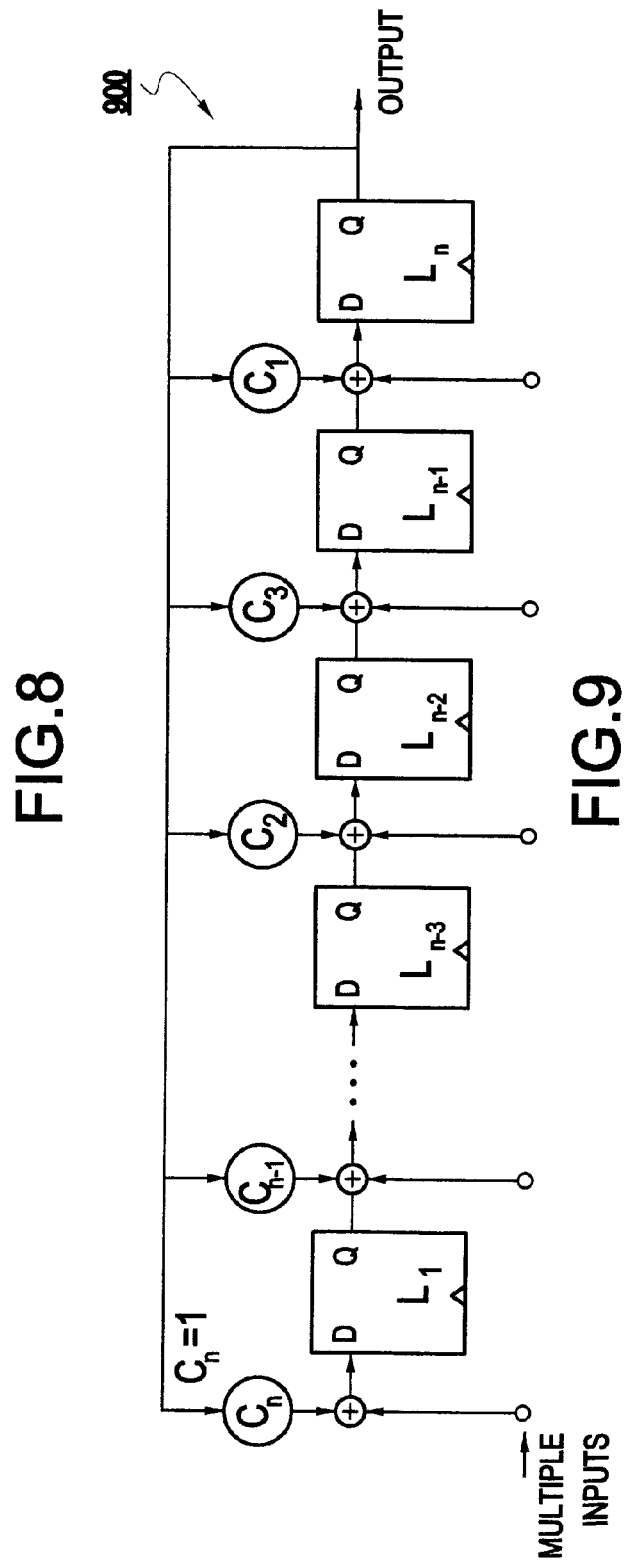
FIG. 9 exemplarily shows an LFSR configured as a Multiple Input Signature Register (MISR) 900.

The basic concept includes XORing one or more bits of input data on every Nth shift cycle of the LFSR. Typically, data is clocked into the LFSR on every shift cycle. The LFSR can be configured as a single input SISR or as a multiple input MISR. The single input configuration 800, exemplarily shown in FIG. 8, is usually used to serially compress long data bit strings, while the multiple input configuration 900, exemplarily shown in FIG. 9, can be used for simultaneous parallel compression of multiple bits groups such as a byte or word of input data.

The data input(s) to the LFSR can be XORed at any point in of the recirculating shift register. Of course, the maximum number of possible single inputs for an N-length LFSR is N. If the number of inputs is greater than N, one could easily increase the length of the LFSR or XOR subsets of inputs for each MISR input.

The output or signature of the SISR or MISR is usually the final state of the LFSR after all the data has been compressed or shifted into the LFSR. The length of the output signature can be the whole length of the LFSR or a truncated portion of N.

Figure 10:
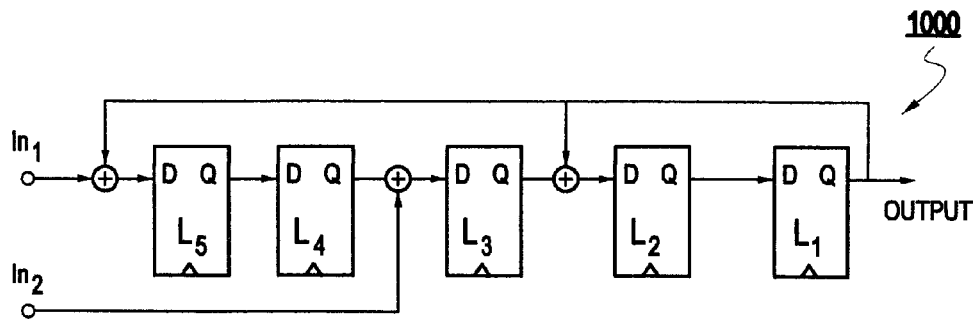
FIG. 10 exemplarily depicts an example of a 2-input 5-stage MISR example 1000.
Figure 11:
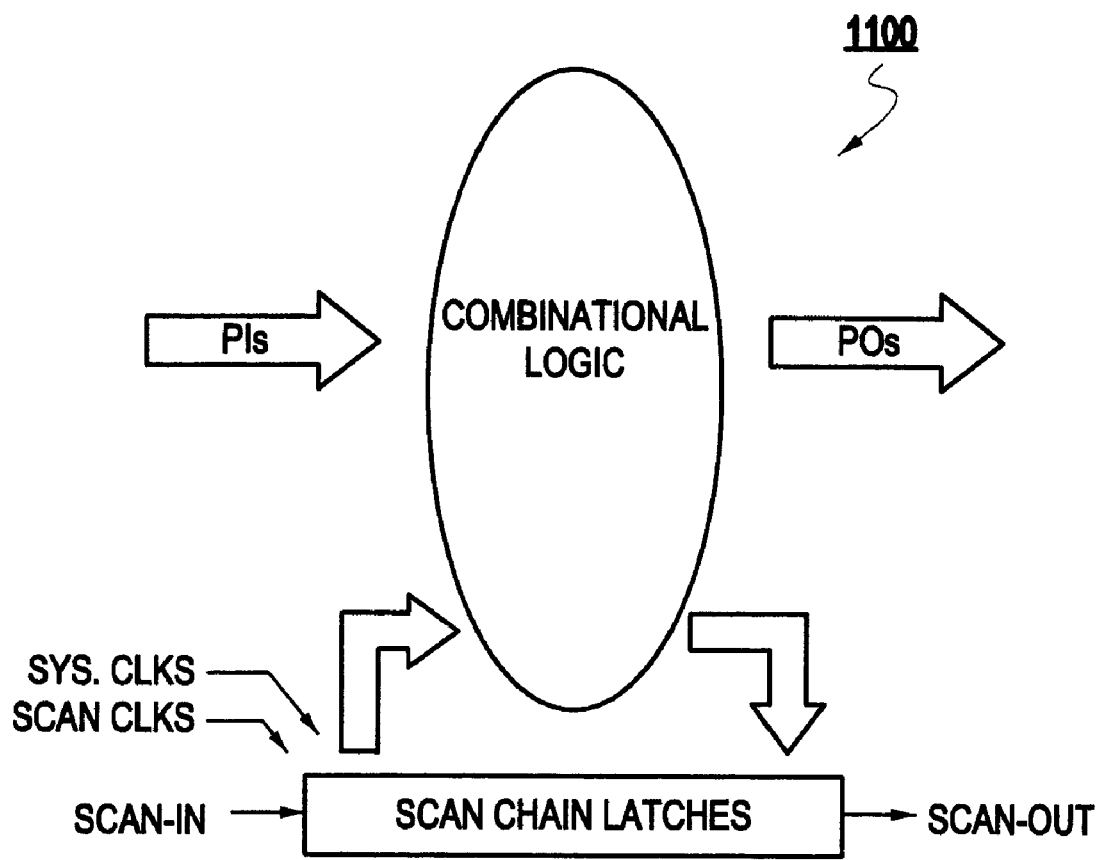
FIG. 11 exemplarily shows a typical LSSD structure 1100.
Figure 12:
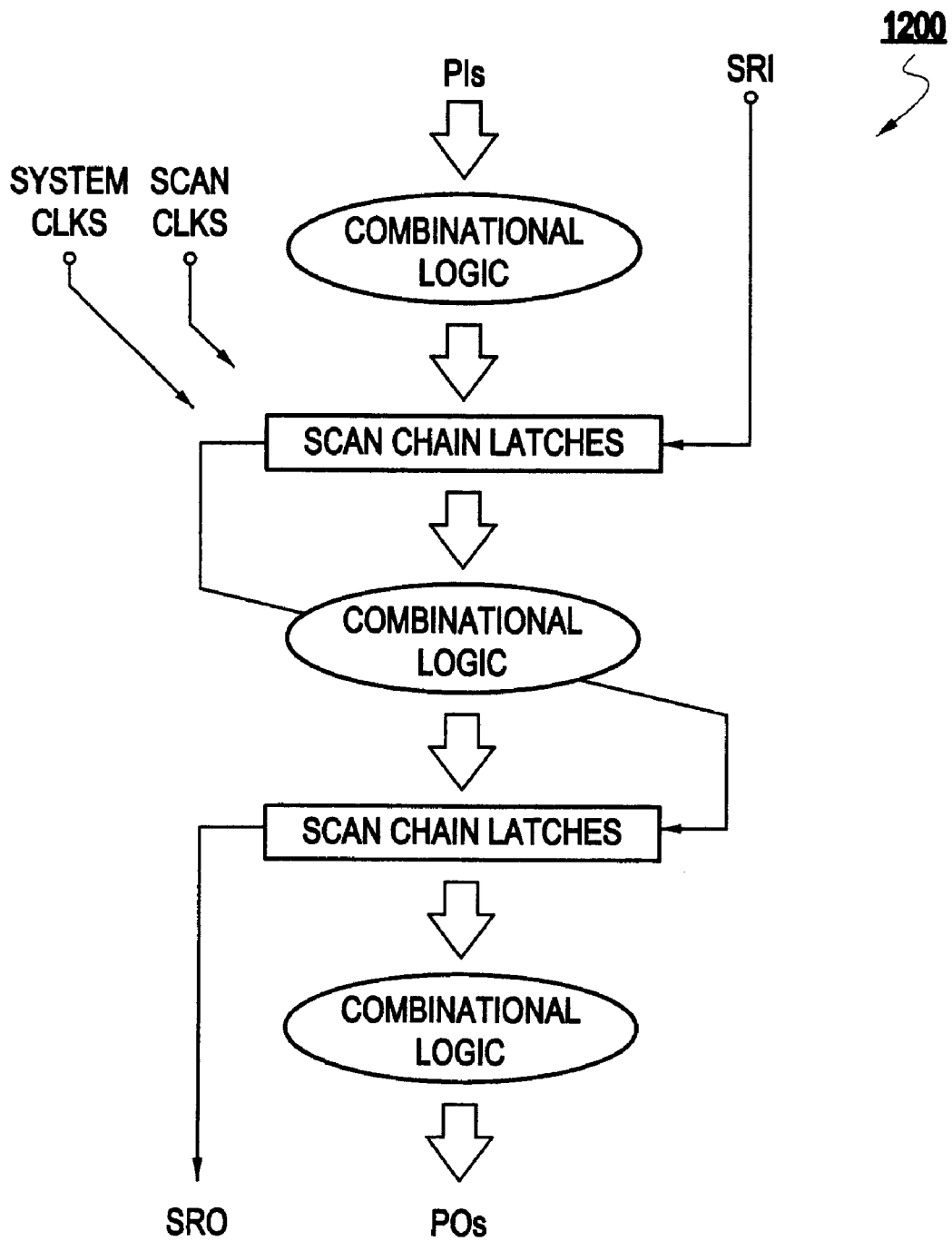
FIG. 12 exemplarily shows a typical LSSD configuration 1200.

The MISR or SISR can be further customized by selecting the initial seed or state prior to data compression, selecting the feedback configuration, input structure, number of shift cycles per data bit(s), and lengths of the LFSR. The length of the LFSR can be optimized for a particular system platform (i.e., 32-bits, 64-bits, 128-bits, 256-bits, or any bit length) or tailored for security robustness. FIG. 10 exemplarily depicts an example of a 2-input 5-stage MISR example 1000 with the associated state table for two input data sequences.

Logic Scan Design & Test

In this overview of the scan-based design and test methodology, one example will be discussed, although many of the basic concepts apply to other variations of scan designs.

The Level Sensitive Scan Design (LSSD) methodology is a system design and a Design-for-Test (DFT) approach that incorporates several basic test concepts. In such a design, most of the storage elements of the device, such as latches or registers are concatenated in one or more scan chains and can be externally accessible via one or more serial inputs and outputs. Storage elements that are not in this category are usually memory or other special macros that are isolated and tested independently. Furthermore, this design methodology ensures that all logic feedback paths are gated by one or more of these storage elements, thereby simplifying a sequential design into subsets of combinational logic sections, as exemplarily shown in FIG. 11 and FIG. 12.

These basic design concepts, in conjunction with the associated system and scan clocking sequences, greatly simplify the test generation, testing, and diagnosability of very complex logic structures. Every latch can be used as a pseudo Primary Input (PI) and as a pseudo Primary Output (PO), in addition to the standard PIs and POs, to enhance the stimulation and observability of the device being tested or diagnosed.

Figure 13:
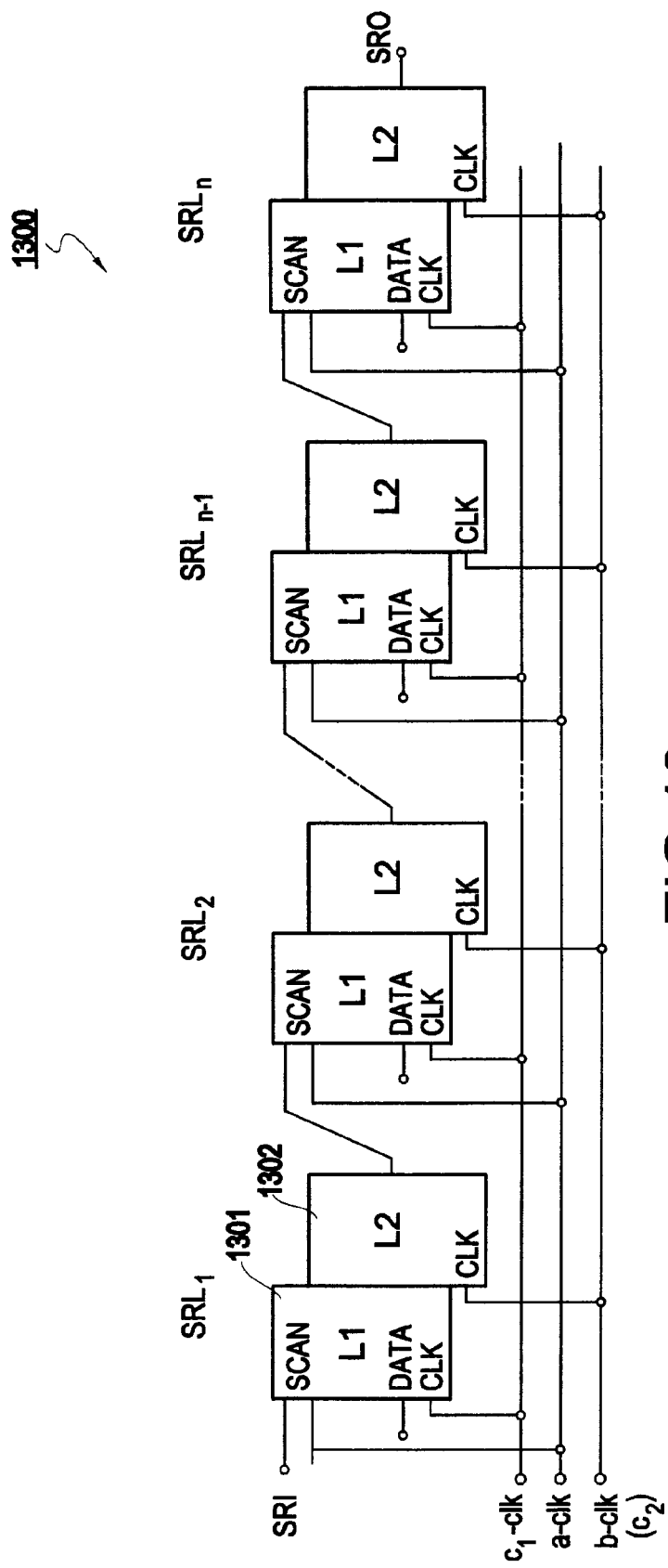
FIG. 13 exemplarily shows a typical LSSD scan chain 1300.
Figure 14:
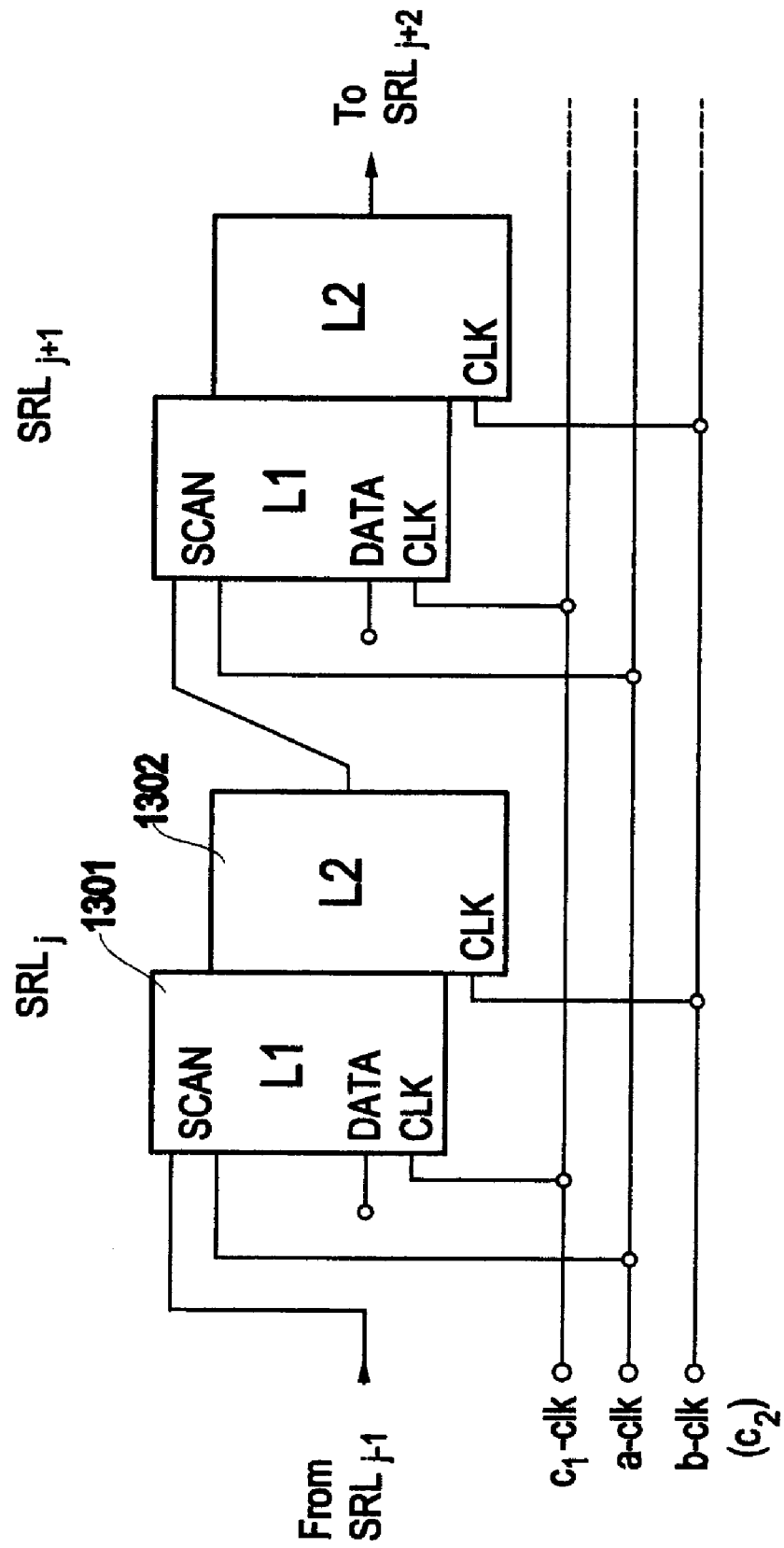
FIG. 14 exemplarily shows a configuration 1400 of two consecutive LSSD scan chain latches.

As exemplarily shown in FIGS. 13 and 14, LSSD latches 1300 are typically implemented in a L1/L2 configuration where the L1 or master latch 1301 has two data ports ("SRI" and "Data") and may be updated by either a scan clock (a) or a functional clock ($c_1$). The L2 or slave latch 1302 has only one clock input (b-clk($c_2$)) and that clock is out of phase with both L1 clocks. Scanning is done using separate A and B clocks.

LBIST Overview

Figure 15:
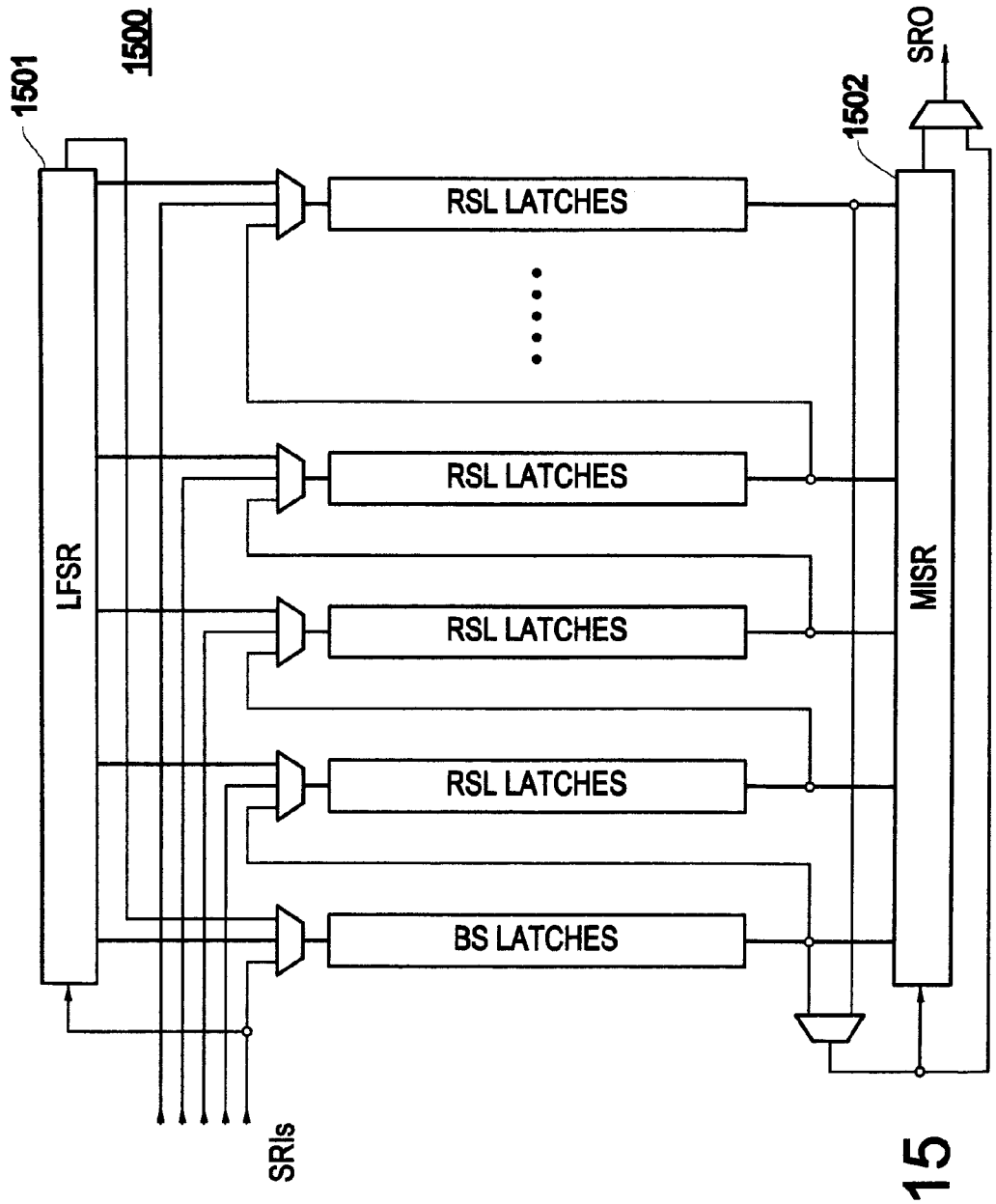
FIG. 15 exemplarily shows a STUMPS (Self Test Using MISR and Parallel SRSG (Shift Register Sequencing Generating)) configuration 1500.

Two basic components of the LBIST structure 1500 shown in FIG. 15 are a Linear Feedback Shift Register (LFSR) 1501 and a Multiple Input Signature Register (MISR) 1502. The LFSR serves as a pseudo random pattern generator that provides the stimuli for the logic being tested, while the MISR is utilized to generate a unique signature representing the responses from the logic. Ideally, the signature for each failing device is different from the signature of a good device after a predefined number of test cycles.

The configuration of the scan chain in the LBIST test mode is partitioned into several sub-chains of approximately the same length. These chains are loaded and unloaded serially for each LBIST test. Once in LBIST mode, the scan chain is reconfigured into a number of parallel sub-chains, as exemplarily shown in FIG. 15. The pseudo random data loaded in parallel into each sub-chain is supplied by the LFSR and used as test stimuli. Similarly, the state of all latches in the sub-chains are unloaded serially into the MISR forming a signature representing the compressed data.

Each LBIST test cycle, in addition to the loading and unloading of the sub-chains, requires timed application of system clocks to launch the test vector from these latches through the combinational logic and capture the resulting response in the receiving latches. Since a typical system design may include several system clocks and various path delays, the clock test sequence and timing set-up may be applied multiple times with different clock combinations and timings. Typically, this is accomplished by an on-product clock generation (OPCG) function and LBIST control.

An LBIST test interval in turn includes a relatively large number of these load/unload sequences followed by the system clock cycle. At the end of the interval, the MISR contents or signature is unloaded and compared to an expected signature. Several signature intervals may be applied to achieve the desire test coverage.

This LBIST methodology is an effective Design for Test (DFT) that can support structural test from the chip level, various package levels, up to the system level. Some of the benefits associated with this approach include relatively low test data volumes, minimal VLSI test system requirements, at-speed test rates, and extendibility to system test.

Recycle Scanning of the Present Invention

Therefore, given the above technical background information and as mentioned above, a key aspect of the present invention is to modify the scan chain design such that the same critical stimuli pattern can be restored and re-applied on every cycle, thereby causing this critical pattern to be repeated many times to amplify the photonic emission detection ability during this critical pattern.

This pattern-restore-function can be accommodated by a simple SRL design modification described below (e.g., see FIG. 16). This function is referred to as a "back-shift L2 restorable latches".

In addition to the scan chain back-shift modification, the complete solution of the present invention also uses existing BIST diagnostic methodologies to isolate the critical pattern and a custom timing sequence to setup and execute the PICA acquisition loop.

The novel concepts are based on the LBIST test methodology, a back-shift-restore scan chain design, and PICA diagnostic techniques that are executed in two test phases. The first phase utilizes the LBIST test and diagnostic methods to identify the failing tester loop and isolate the associated failing latches, while the second phase utilizes a modified LBIST clocking sequence in conjunction with the PICA tool to diagnose the fault to the failing net, logic block, or device. These two phases are exemplarily summarized in the following steps.

Phase I:

1. A LBIST test sequence is executed (skewed load OPCG clocking sequence);

2. Failing tester loop(s) are identified, using binary search, etc.; and

3. Failing Representative Measurable Latch(es) (RML(s)) for each identified failing tester loop are identified.

Phase II:

1. The LBIST test (or functional patterns) is executed up to the failing tester loop (same as in Phase I);

2. The failing tester loops random stimuli is loaded into the L1 latches (this step would be normally done during the previous tester loop channel scan load/unload operation and may not be required);

3. A tight loop is applied on a single clocking sequence by continuously applying launch clocks ($c_2$-clks) and back-shift-restore;

4. While looping at high rates on the above special clocking sequence, the PICA tool is used to trace back from the failing RML to the defect location; and 5. The same clocking sequence can be used to loop on a functional pattern, after sequencing to the failing pattern.

This basic concept applies to structural as well as functional test patterns diagnostics and can be extended to critical signal path characterization. Furthermore, the concept can be used to diagnose stuck-at scan chains and for delta-I noise analysis.

Figure 16:
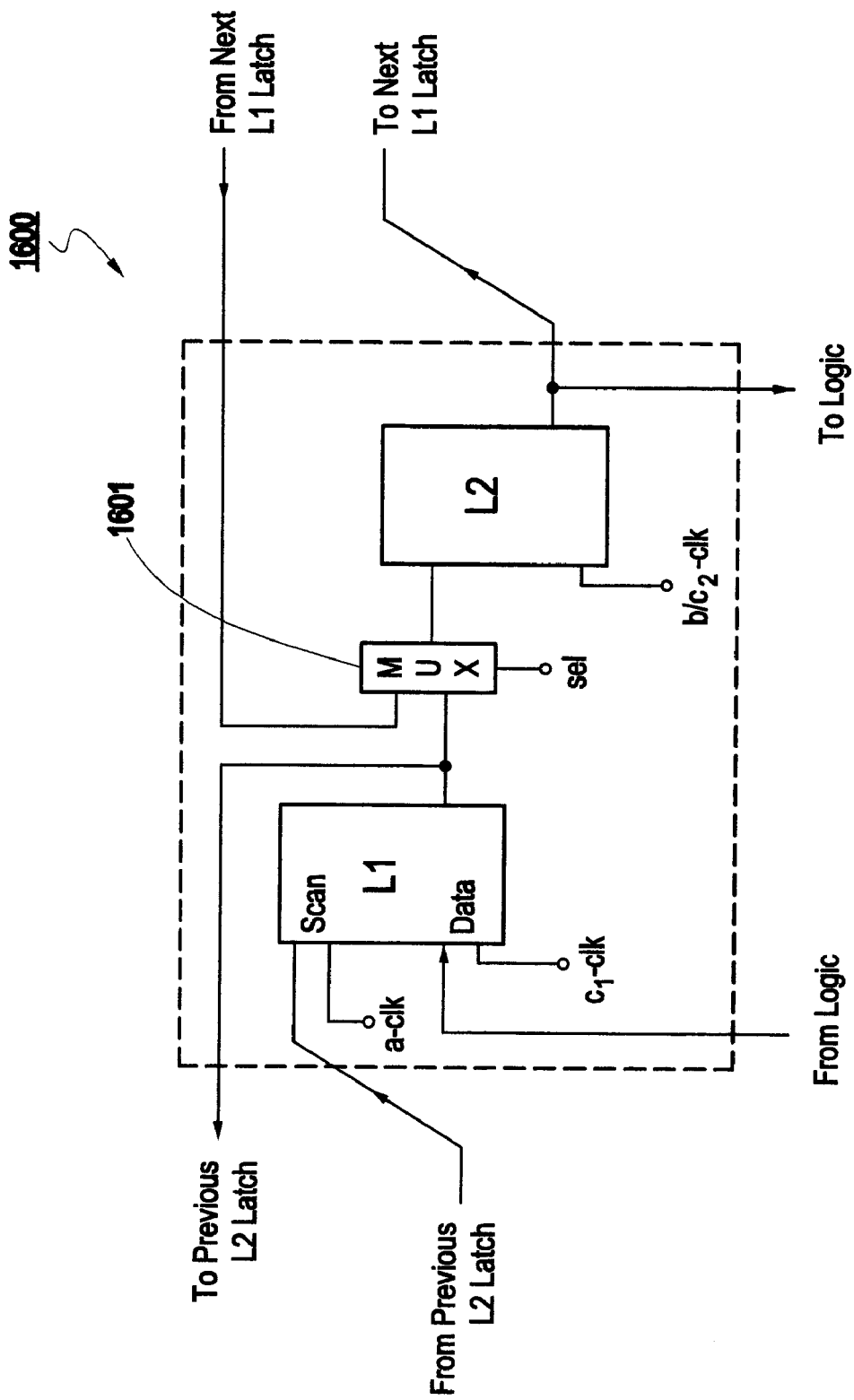
FIG. 16 shows an exemplary embodiment 1600 of the present invention in which the L1/L2 latches are interconnected by a multiplexer.
Figure 17:
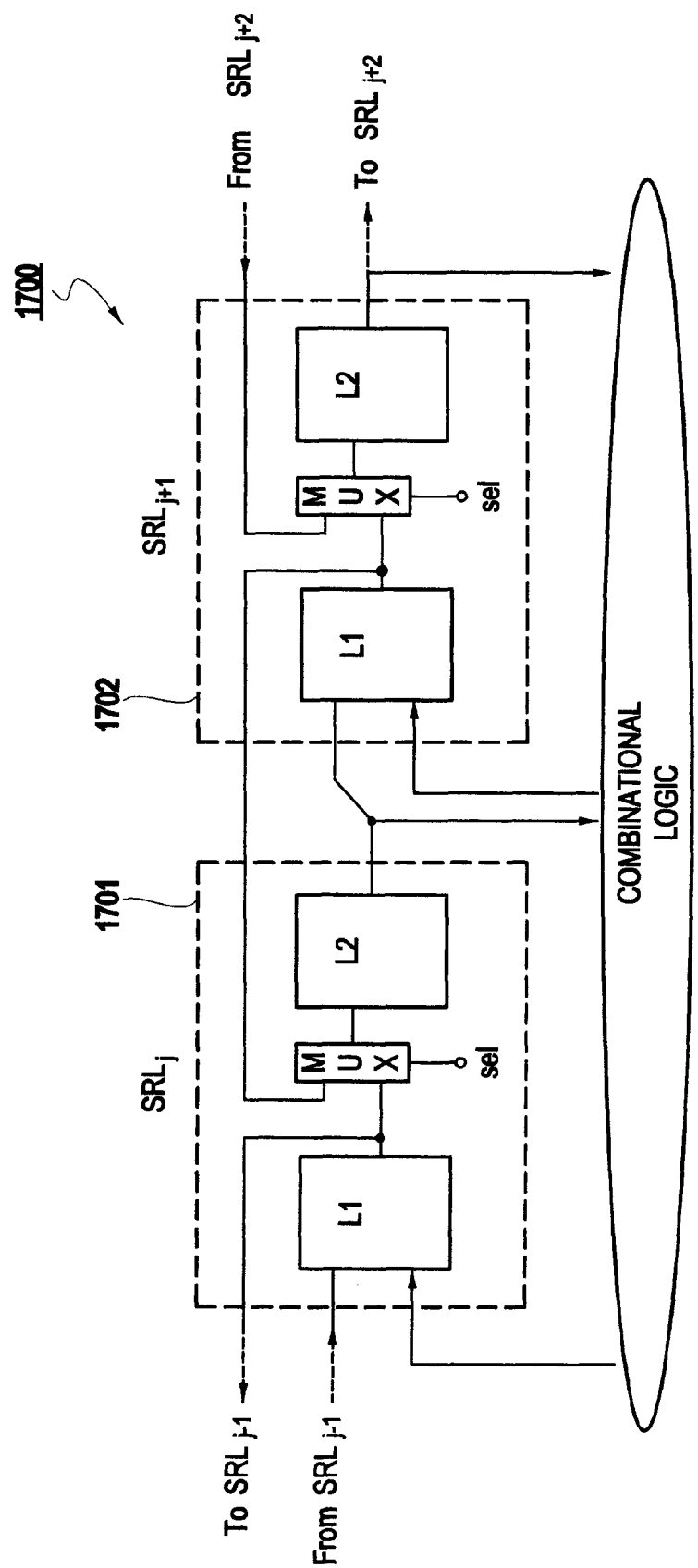
FIG. 17 exemplarily shows a configuration 1700 of two sequential Shift Register Latches (SRLs) as interconnected in accordance with the concepts of the present invention.

FIG. 16 exemplarily depicts the basic L2 restorable function for a typical LSSD L1/L2 latch 1600, as modified for the present invention. The restore function is achieved by providing an alternate data path to the L2 latch. In the example, this is achieved by a multiplexor (MUX) 1601 or other selector block that, in the normal scan mode selects the output of the L1 latch from the same latch, while in the PICA acquisition mode selects the output of the L1 from the next RSL (Representative Scannable Latch) of the scan chain. The MUX selection is controlled by a global control signal (SEL). FIG. 17 shows the configuration 1700 of two interconnected SRLs 1701, 1702 with the associated back-shift data path.

A somewhat different approach to the MUX 1600 may also use a dual data port L2 latch and select the port by another clock similar to the b/c2-clock. Also, not all RSLs in a design need to be modified to support the restore function, since a partial implementation of critical areas may be sufficient in some applications and test methodologies.

Besides additional silicon real estate due to the L2 restore function, also to be considered are the additional delay introduced in the L1/L2 system path, the loading on the L1 output for the restore feedback, and the associated wiring. These impacts can be minimized by integrating the function within the RSL macro design.

Figure 18:
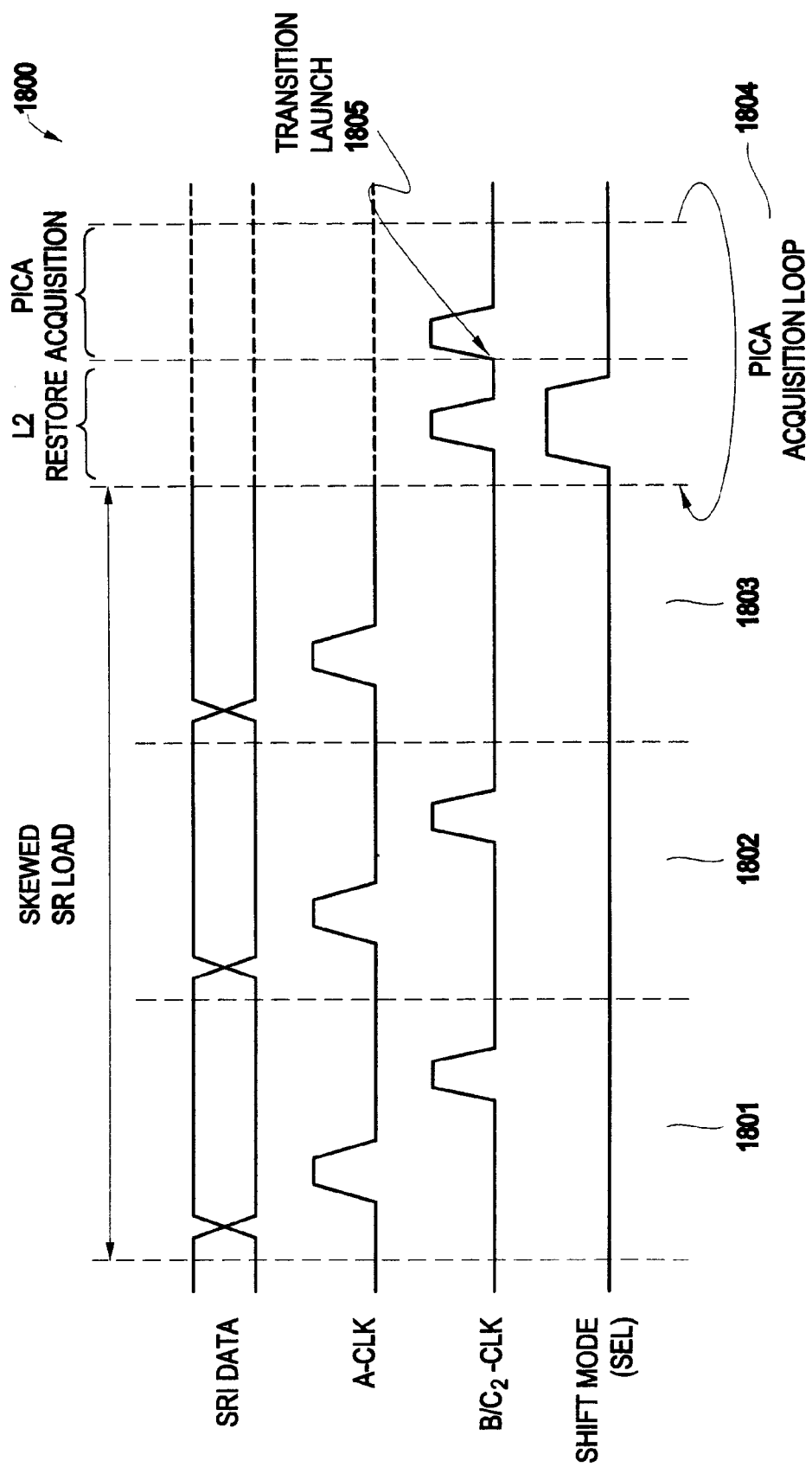
FIG. 18 exemplarily shows a PICA timing setup 1800 for implementing the present invention.

FIG. 18 exemplarily illustrates the timing diagram 1800 for a typical PICA test. The three cycles 1801, 1802, 1803 on the left are part of the pattern setup operation. The data from SRI is loaded via the shift register to all the RSLs for a particular test mode. The last cycle in the SR load sequence is to apply a single a-clock to setup a skewed load. The skewed load allows for the next b/c2-clock to launch a transition through the combinational logic. In a normal test mode, the results from the transition through the logic are typically captured in the L1 latch by applying a c1-clock.

Once the critical pattern has been skew-loaded in the scan chain, the PICA acquisition cycle 1804 can be executed in a tight loop at high rates. The timing for this cycle includes first restoring the L2 latch with the next RSL L1 logic value. This is feasible since the next RSL L1 has been loaded to the same state as the L2 by the skewed-load. Note that this will be true as long as the C1-clock to the L1 is not pulsed.

The second half of the cycle launches the transitions (e.g., see 1805) by applying the b/c2-clock through the combinational logic. The PICA tool is used during this portion of the cycle to observe these transitions in time and space. Since the L1s are not clocked during this sequence, re-executing the cycle allows for restoring the L2 and reapplying the same transitions as often as necessary for an effective PICA data acquisition and subsequent analysis.

Figure 19:
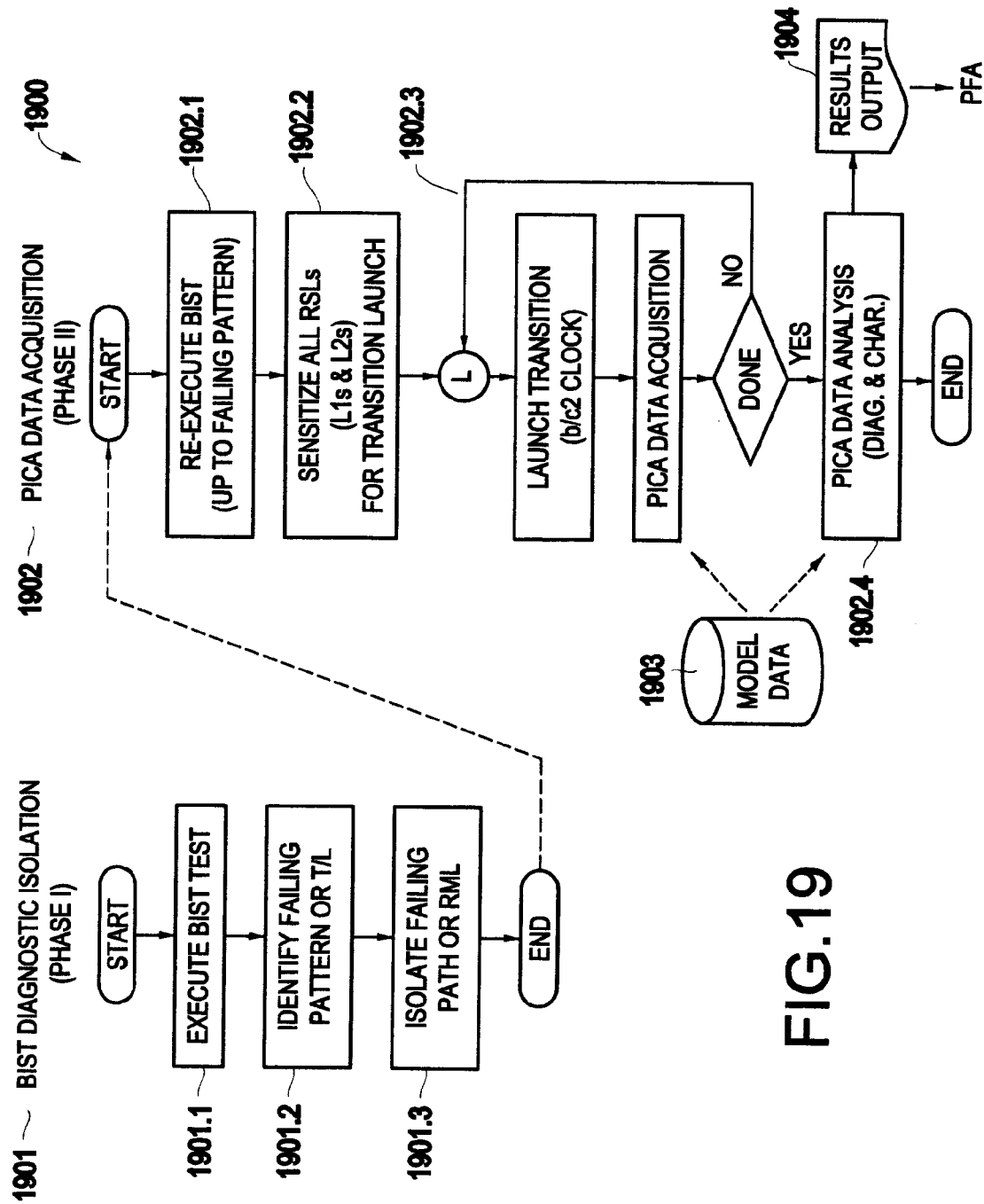
FIG. 19 shows an exemplary PICA diagnosis flow 1900 in accordance with the present invention.

FIG. 19 is an exemplary two-phased process flow describing the overall concept. Phase I (e.g., 1901) include the steps 1901.1 involved in a typical LBIST diagnostic process to first identify, in step 1901.2, one or more failing or critical patterns or tester loops (T/Ls).

The next step 1901.3 is to further identify the specific failing paths or RMLs. This information is then used to setup the individual critical pattern conditions for Phase II (e.g., PICA data acquisition). Although there are many techniques used in BIST diagnostics, such as binary searches, selective signature generation, etc., the details if these methods can be found in references outside the scope of this application.

The steps 1902 of Phase II utilize the results from the LBIST diagnostics to set up the critical pattern and then execute that pattern is a tight loop while collecting backside emission data. The setup includes, in step 1902.1, of executing LBIST up to the pattern of interest, including the skewed load. Once the pattern is set up, the mode is switched to a "back-shift L2-restore & PICA acquisition" looping cycle 1902.3. The looping pattern 1902.3 is executed for as long as necessary for proper PICA timing and spatial resolution. PICA waveforms are then analyzed to determine the circuit functionality and timing characteristics for the output Physical Failure Analysis (PFA).

Although the LSSD scan chain and the LBIST test methodology has been used as an example for a specific embodiment of the idea, the basic concept can be extended to other types of scan designs and diverse BIST designs. Furthermore, the concept not only applies to structural test, but can also be used in a functional test environment with latch restore capability.

Exemplary Hardware Implementation

FIG. 20 illustrates a typical hardware configuration of an information handling/computer system in accordance with the present invention and which preferably has at least one processor or central processing unit (CPU) 2011.

The CPUs 2011 are interconnected via a system bus 2012 to a random access memory (RAM) 2014, read-only memory (ROM) 2016, input/output (I/O) adapter 2018 (for connecting peripheral devices such as disk units 2021 and tape drives 2040 to the bus 2012), user interface adapter 2022 (for connecting a keyboard 2024, mouse 2026, speaker 2028, microphone 2032, and/or other user interface device to the bus 2012), a communication adapter 2034 for connecting an information handling system to a data processing network, the Internet, an Intranet, a personal area network (PAN), etc., and a display adapter 2036 for connecting the bus 2012 to a display device 2038 and/or printer 2039 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 2011 and hardware above, to perform the method of the invention.

This signal-bearing media may include, for example, a RAM contained within the CPU 2011, as represented by the fast-access storage for example. Alternatively, the instructions may be contained in another signal-bearing media, such as a magnetic data storage diskette 2100 (FIG. 21), directly or indirectly accessible by the CPU 2011.

Whether contained in the diskette 2100, the computer/CPU 2011, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code.

While the invention has been described in terms of exemplary embodiments, those skilled in the art will recognize that the invention can be practiced with modification within the spirit and scope of the appended claims.

Further, it is noted that Applicants' intent is to encompass equivalents of all claim elements, even if amended later during prosecution.

Having thus described our invention, what we claim as new and desire to secure by Letters Patent is as follows:

1. An electronic circuit, comprising:
   at least one scan chain of latches, for providing a test stimuli pattern to an associated combinatorial logic circuit; and
   a mechanism to allow a data flow in said scan chain to be reversed in direction so that a critical stimuli pattern can selectively be restored and thereby repeated by at least a portion of said at least one scan chain,
   wherein each said latch comprises a master flipflop and a slave flipflop and said mechanism to reverse data flow comprises a multiplexer interconnected between said master flipflop and said slave flipflop, and
   wherein said multiplexer between said master flipflop and said slave flipflop is interconnected such that said slave flipflop receives, as based on a control signal to said multiplexer, an input signal from a selected one of:
      an output from said master flipflop, thereby permitting said test stimuli pattern to progress; and
      an output from a second master flipflop from a next subsequent stage in said scan chain, thereby restoring said critical stimuli pattern for a repeat execution through said slave flipflop.

2. An electronic apparatus, comprising:
   at least one electronic circuit of claim 1.

3. The electronic circuit of claim 1, said electronic circuit comprising a subsystem in a Built-In Self Test (BIST) circuit, said BIST circuit receiving a control signal allowing said critical stimuli pattern to selectively be re-applied as part of a test procedure testing a device that has said BIST circuit incorporated therein.

4. The electronic circuit of claim 3, said device further comprising:
   a controller to control an execution of said Built-In Self Test (BIST) circuit, including said control signal.

5. The electronic circuit of claim 1, wherein said mechanism to reverse data flow further comprises a controller to provide a control signal to said multiplexer, said controller thereby controlling the multiplexers in at least a portion of said scan chain to switch in a manner that restores said critical test stimuli pattern so that it will be repeated.

6. A method of providing a scan signal for a Built-In Self Test (BIST) circuit, said method comprising:
   providing a BIST circuit in a device;
   providing a scan chain of latches in said BIST circuit; and
   including a mechanism, in said scan chain of latches for said BIST circuit, to allow a data flow of said scan signal in said scan chain to selectively be reversed in direction so that a critical test stimuli pattern is selectively restored and thereby repeated one more time,
   wherein each said latch comprises a master flipflop and a slave flipflop and said mechanism to reverse data flow comprises a multiplexer interconnected between said master flipflop and said slave flipflop, such that said multiplexer selectively provides said slave flipflop with an input signal from either an output signal of said master flipflop or an output signal of a master flipflop in a next, subsequent stage in said scan chain.

7. The method of claim 6, wherein said mechanism further comprises providing a control signal to control a direction of said data flow, said control signal allowing said critical test stimuli pattern to selectively be re-applied as part of a test procedure.

8. A scan chain comprising a plurality of units and used for testing a combinatorial circuit associated with at least a portion of said scan chain, each said unit of said scan chain comprising:
- an L1 latch that receives an input signal from a preceding stage of said scan chain and that provides an output signal; and
- an L2 latch that provides an output signal to be an input signal to a combinatorial logic associated with said scan chain and an input signal to an L1 latch in a subsequent unit of said scan chain, wherein said L2 latch receives selectively, as an input signal, either:
  - the output signal from said L1 latch in said unit itself, thereby permitting a test stimuli pattern to progress normally forward through the L2 latch; or
  - an output signal from an L1 latch in a subsequent unit in said scan chain, thereby permitting the test stimuli pattern to be restored from the subsequent unit and repeated one more time through the L2 latch.

9. The scan chain of claim 8, wherein said L1 latch and said L2 latch in said unit is interconnected through a multiplexer that is controlled to selectively provide said L2 latch with said input signal based on whether the test stimuli pattern in said scan chain is progress forward or is to be restored and repeated one more time.

* * * * *